United States Patent
Zeng et al.

(10) Patent No.: US 12,265,109 B2
(45) Date of Patent: Apr. 1, 2025

(54) DEVICE AND METHOD FOR MEASURING MICROWAVE SURFACE RESISTANCE OF DIELECTRIC CONDUCTOR DEPOSITION INTERFACE

(71) Applicant: University of Electronic Science and Technology of China, Sichuan (CN)

(72) Inventors: Cheng Zeng, Sichuan (CN); Tianhui Sun, Sichuan (CN); Junsong Ning, Sichuan (CN); Shirong Bu, Sichuan (CN); Zhanping Wang, Sichuan (CN)

(73) Assignee: University of Electronic Science and Technology of China, Sichuan (CN)

( * ) Notice: Subject to any disclaimer, the term of this patent is extended or adjusted under 35 U.S.C. 154(b) by 210 days.

(21) Appl. No.: 18/098,704

(22) Filed: Jan. 19, 2023

(65) Prior Publication Data
US 2023/0152360 A1    May 18, 2023

(30) Foreign Application Priority Data

May 18, 2022 (CN) .......................... 202210544239.X

(51) Int. Cl.
*G01R 27/26*    (2006.01)
(52) U.S. Cl.
CPC .................. *G01R 27/2688* (2013.01)
(58) Field of Classification Search
CPC ........ G01N 22/00; G01R 27/02; G01R 27/04; G01R 27/2688
See application file for complete search history.

(56) References Cited

U.S. PATENT DOCUMENTS

| | | | |
|---|---|---|---|
| 2008/0205595 A1* | 8/2008 | Lee ...................... | G01B 15/025 378/54 |
| 2021/0205894 A1* | 7/2021 | Long ...................... | B22F 10/85 |
| 2023/0232723 A1* | 7/2023 | Wosik ................... | C23C 16/545 505/230 |

FOREIGN PATENT DOCUMENTS

CN    104316769 A  *  1/2015

OTHER PUBLICATIONS

Zeng, Cheng & Luo, ZhengXiang & Bu, Shirong & Yang, Kai & Zhang, QiShao. (2010). A novel method for the measurement of frequency-character of surface resistance of HTS thin film. Chinese Science Bulletin. 55. 1088-1091. 10.1007/s11434-009-0639-8.

(Continued)

*Primary Examiner* — Judy Nguyen
*Assistant Examiner* — Adam S Clarke

(57) ABSTRACT

A device for measuring a microwave surface resistance of a dielectric conductor deposition interface includes: a test platform, a calibration component, a sealing cavity and a support plate; wherein the test platform comprises: a shielding cavity having an open bottom, a dielectric rod, an input coupling structure, an output coupling structure, and a dielectric supporter; the dielectric conductor test sample and the test platform form a $TE_{0m(n+\delta)}$ mode dielectric resonator; the calibration component and the dielectric conductor test sample are mounted on the test platform to measure corresponding quality factors, thereby calculating the microwave surface resistance of the deposition interface of the dielectric conductor test sample. The present invention requires no pre-measurement of relative permittivity and loss tangent of the dielectric conductor test sample. After calibration, the microwave surface resistance of the dielectric conductor deposition interface can be obtained by only one non-destructive measurement.

6 Claims, 3 Drawing Sheets

(56) References Cited

OTHER PUBLICATIONS

Zeng, Cheng & Chen, Liu & Bu, Shirong & Ning, Junsong & Meng, Ben & Zhang, Qishao. (2015). An Efficient and Accurate Method for HTS Surface Resistance Measurement. Journal of Superconductivity and Novel Magnetism. 28. 10.1007/s10948-015-3199-y.

Zeng, Cheng & Chen, Liu & Bu, Shirong & Ning, Junsong & Zhang, Qishao & Wang, Zhanping. (2019). Characterizing the Distribution of Microwave Surface Resistance of HTS Film Based on Metal Ring. Journal of Superconductivity and Novel Magnetism. 32. 10.1007/s10948-018-4923-1.

* cited by examiner

DEVICE AND METHOD FOR MEASURING MICROWAVE SURFACE RESISTANCE OF DIELECTRIC CONDUCTOR DEPOSITION INTERFACE

CROSS REFERENCE OF RELATED APPLICATION

The present invention claims priority under 35 U.S.C. 119(a-d) to CN 202210544239.X, filed May 18, 2022.

BACKGROUND OF THE PRESENT INVENTION

Field of Invention

The present invention relates to electronics, and more particularly to a device and a method for measuring a microwave surface resistance of a dielectric conductor deposition interface.

Description of Related Arts

Passive devices are an important part of microwave devices. In planar transmission lines, performance of the passive devices depends on the microwave surface resistance of the dielectric conductor deposition interface of microwave plates. After the conductor is deposited on the dielectric surface, the microwave surface resistance of the dielectric conductor interface is usually different from that of the conductor due to the impact of process. Therefore, obtaining the accurate microwave surface resistance of the dielectric conductor deposition interface is quite important for microwave substrate evaluation and passive device high-precision design.

Dielectric resonance method is commonly used to measure the microwave surface resistance of the dielectric conductor interface (see Hirayama, N. et al. "Measurement Technique for Interface and Surface Conductivities at Millimeter-Wave Frequencies Using Dielectric Rod Resonator Excited by Nonradiative Dielectric Waveguide." IEEE Transactions on Microwave Theory and Techniques 5(2022):70), and a typical structure thereof is shown in FIG. 1. According to such method, a sample is placed at a bottom end of a dielectric rod resonator, and a $TE_{02\delta}$ mode is excited in a dielectric rod by coupling devices on both sides, so as to measure an unloaded quality factor Q of a resonant cavity. Before calculating the microwave surface resistance (or conductivity) of the sample, it is necessary to first use other devices to measure the relative permittivity $\varepsilon_r$ and the loss tangent tan $\delta$ of the dielectric rod and the dielectric substrate, and further simulate and calculate the geometric factor G and part of the dielectric resonator power fill factor P. These additional measurements make the operation and computation complex.

SUMMARY OF THE PRESENT INVENTION

To solve the problems in the prior art, the present invention provides a device and a method for quickly measuring a microwave surface resistance of a dielectric conductor deposition interface. The present invention adopts calibration technology, wherein electromagnetic energy stored and power loss by all structures except the test sample can be determined and a geometric factor of a test device can be obtained without measuring electrical parameters of the resonant cavity dielectric rod and the sample dielectric layer. After calibration, the microwave surface resistance (or conductivity) of the test sample at the test frequency can be obtained by merely measuring the unloaded quality factor Q of the test device with test sample loaded. The method has simple operation steps, high efficiency, good repeatability and low cost, and is especially suitable for mass testing.

Accordingly, in order to accomplish the above objects, the present invention provides:

a device for measuring a microwave surface resistance of a dielectric conductor deposition interface, comprising: a test platform, a calibration component, a sealing cavity and a support plate;

wherein the test platform comprises: a shielding cavity having an open bottom, a dielectric rod, an input coupling structure, an output coupling structure, and a dielectric supporter; wherein the input coupling structure and the output coupling structure are symmetrically distributed on two sides of the shielding cavity; the dielectric rod is located inside the shielding cavity, and is fixed to the shielding cavity by the dielectric supporter; a bottom end of the dielectric rod and a bottom concave of the shielding cavity are on a same plane;

wherein a dielectric conductor test sample is placed on the bottom end of the dielectric rod and the bottom concave of the shielding cavity, and a depth of the bottom concave is the same as a thickness of the test sample; the dielectric conductor test sample is detachably fastened by the support plate to form a $TE_{0m(n+\delta)}$ (m, n=1, 2, 3 ...) mode dielectric resonator with the test platform; wherein the dielectric conductor test sample is formed by a dielectric material with a certain thickness and a metal conductor with a certain thickness attached to one end of the dielectric; a dielectric side of the dielectric conductor test sample faces an interior of the dielectric resonator, and a conductor side is attached to the support plate;

wherein the calibration component is detachably arranged on the bottom ends of the dielectric rod and the shielding cavity; and wherein the sealing cavity is detachably arranged on an extension part of the bottom end of the shielding cavity, so as to shield the calibration component, or the support plate and the dielectric conductor test sample.

Preferably, the calibration component comprises: a calibration plate, a calibration holder, and a calibration dielectric plate; wherein an internal resonant structure of the calibration holder is identical to that of the test platform; the calibration dielectric plate comprises two dielectric plates, and sizes and materials of the two dielectric plates are identical to those of a dielectric layer in the dielectric conductor test sample. The two dielectric plates replace the dielectric conductor test sample and the support plate to be placed on the bottom end of the dielectric rod of the test platform and the calibration holder as well as the bottom concave of the shielding cavity. The calibration holder and the test platform are placed opposite to each other, and internal resonant structures are symmetrical about end faces. The calibration plate is a metal plate with a known microwave surface resistance. After the calibration dielectric plate is placed on the test platform, the calibration plate is placed on a surface of the calibration dielectric plate.

Preferably, the test platform is concentric with the dielectric rod and the dielectric supporter.

Preferably, the shielding cavity is made of a hard metal material; the dielectric rod adopts a material with low loss, high dielectric constant and high Q value, comprising rutile, sapphire and beryllium oxide ceramics; and the dielectric supporter adopts a material with low loss and low dielectric constant, comprising nylon, polytetrafluoroethylene and polyethylene foam.

Preferably, a size of the dielectric conductor test sample is larger than an open area of the bottom concave of the shielding cavity.

Preferably, both the input coupling device and the output coupling device adopt a coupling hole-to-coaxial structure.

Preferably, for the $TE_{0m(n+\delta)}$ (m, n=1, 2, 3 . . . ) mode dielectric resonator, a resonant frequency and a physical size thereof are calculated through analyzing Maxwell's equations based on boundary conditions.

The present invention also provides a method for measuring a microwave surface resistance of a dielectric conductor deposition interface with the above device, comprising steps of:

step 1: mounting the calibration plate and the calibration dielectric plate on the test platform, and then sealing with the sealing cavity; keeping an obtained test device at a working temperature of the dielectric conductor test sample, and measuring an unloaded quality factor $Q_1$;

step 2: mounting the calibration holder and the calibration dielectric plate on the test platform, and then sealing with the sealing cavity; keeping the obtained test device at the working temperature of the dielectric conductor test sample, and measuring an unloaded quality factor $Q_2$;

wherein the above two steps are called calibration;

step 3: mounting the dielectric conductor test sample on the test platform, fastening with the support plate, and then sealing with the sealing cavity; keeping the obtained test device at the working temperature of the dielectric conductor test sample, and measuring an unloaded quality factor $Q_0$; and step 4: calculating with a formula:

$$R_s = \frac{Q_0^{-1} - X}{Y} = \frac{Q_0^{-1} - Q_2^{-1}}{Q_1^{-1} - Q_2^{-1}} \times R_{s1}$$

to obtain a microwave surface resistance $R_s$ of the dielectric conductor test sample; wherein $R_{s1}$ is a microwave surface resistance of the calibration plate.

Compared with the prior art, the beneficial effects of the present invention are as follows.

The present invention provides the device and the method for measuring the microwave surface resistance of the dielectric conductor deposition interface. The $TE_{0m(n+\delta)}$ mode is used as a working mode of the dielectric resonator. Under this working mode, the dielectric resonator has high unloaded quality factor and high test sensitivity. After calibration with a specific device structure, the microwave surface resistance of the dielectric conductor deposition interface can be obtained by only one non-destructive measurement. The present invention has simple operation steps, high efficiency, good repeatability and low cost, which is especially suitable for mass industrial testing.

ELEMENT REFERENCE

1—test platform; 2—dielectric conductor test sample; 3—support plate; 4—sealing cavity; 5—shielding cavity; 6—resonant cavity; 7—input coupling structure; 8—output coupling structure; 9—dielectric supporter; 10—dielectric rod; 11—calibration dielectric plate; 12—calibration plate; 13—calibration holder.

DETAILED DESCRIPTION OF THE PREFERRED EMBODIMENT

In order to make the objects, technical solutions and advantages clearer, the present invention will be further illustrated below in conjunction with embodiments and accompanying drawings. The embodiments and description thereof are exemplary only and not intended to be limiting.

Embodiment 1

Figure 1:
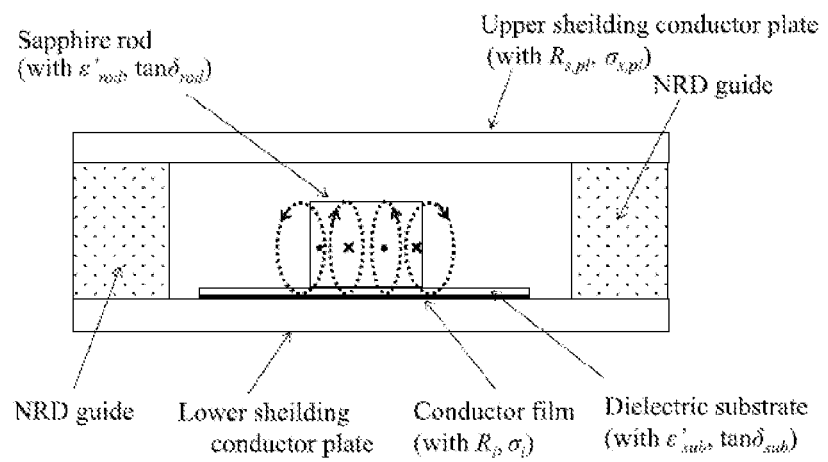
FIG. 1 is a cross-sectional view of a resonator according to a conventional dielectric resonator method.
Figure 2:
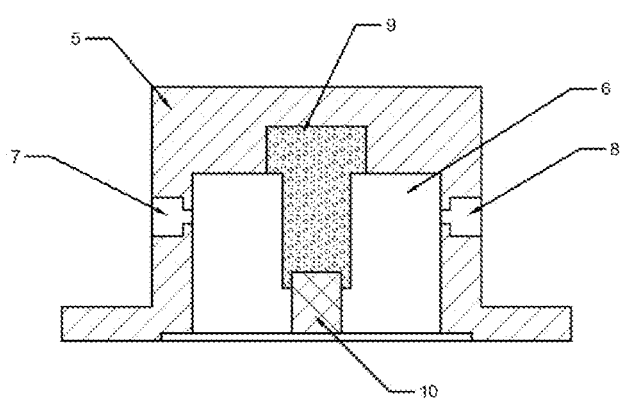
FIG. 2 is a cross-sectional view of a test platform of a device for measuring a microwave surface resistance of a dielectric conductor deposition interface according to an embodiment 1 of the present invention.

The embodiment 1 provides a device for measuring a microwave surface resistance of a dielectric conductor deposition interface, comprising: a test platform 1, a calibration component, a sealing cavity 4 and a support plate 3. Referring to FIG. 2, the test platform 1 comprises: a shielding cavity 5 having an open bottom, a dielectric rod 10, an input coupling structure 7, an output coupling structure 8, and a dielectric supporter 9.

The input coupling structure 7 and the output coupling structure 8 are symmetrically distributed on two sides of the shielding cavity 5, which adopt a coupling hole-to-coaxial structure, so as to effectively avoid direct coupling and have high test accuracy.

The dielectric rod 10 is located inside the shielding cavity 5, and is fixed to the shielding cavity 5 by the dielectric supporter 9; a bottom end of the dielectric rod 10 and a bottom concave of the shielding cavity 5 are on a same plane. A depth of the bottom concave is the same as a thickness of a test sample, and the test platform 1 is concentric with the dielectric rod 10 and the dielectric supporter 9.

Figure 3:
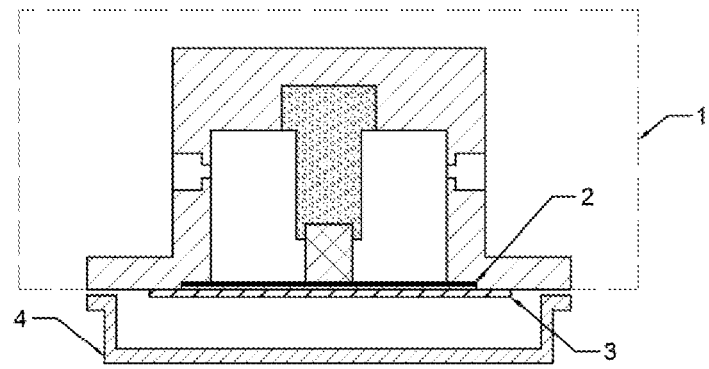
FIG. 3 is a cross-sectional view of the device for measuring the microwave surface resistance of the dielectric conductor deposition interface according to the embodiment 1 of the present invention after loading a dielectric conductor test sample.

A dielectric conductor test sample 2 is placed on the bottom end of the dielectric rod 10 and the bottom concave of the shielding cavity 5, whose size is larger than an internal diameter of the shielding cavity 5; the dielectric conductor test sample 2 is detachably fastened by the support plate 3 to form a $TE_{0m(n+\delta)}$ mode dielectric resonator with the test platform 1, wherein a central area of the dielectric resonator is a resonant cavity 6. The dielectric conductor test sample 2 is formed by depositing a conductor on a dielectric; a dielectric side of the dielectric conductor test sample 2 faces an interior of the dielectric resonator, and a conductor side is attached to the support plate 3. A cross-sectional structure of the device for measuring the microwave surface resistance of the dielectric conductor deposition interface after loading the dielectric conductor test sample 2 is shown in FIG. 3.

Figure 4:
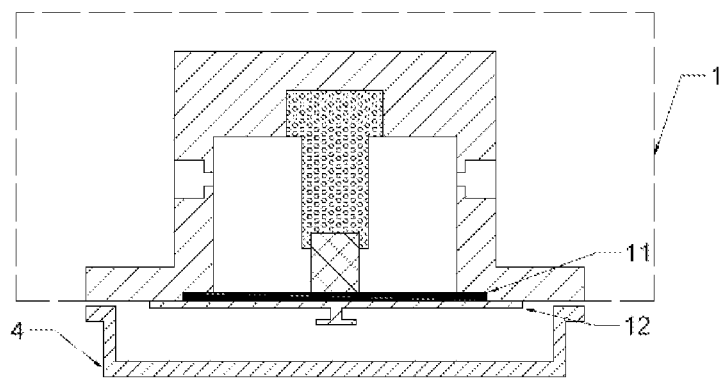
FIG. 4 is a cross-sectional view of the device for measuring the microwave surface resistance of the dielectric conductor deposition interface according to the embodiment 1 of the present invention after loading a calibration plate and a calibration dielectric plate.
Figure 5:
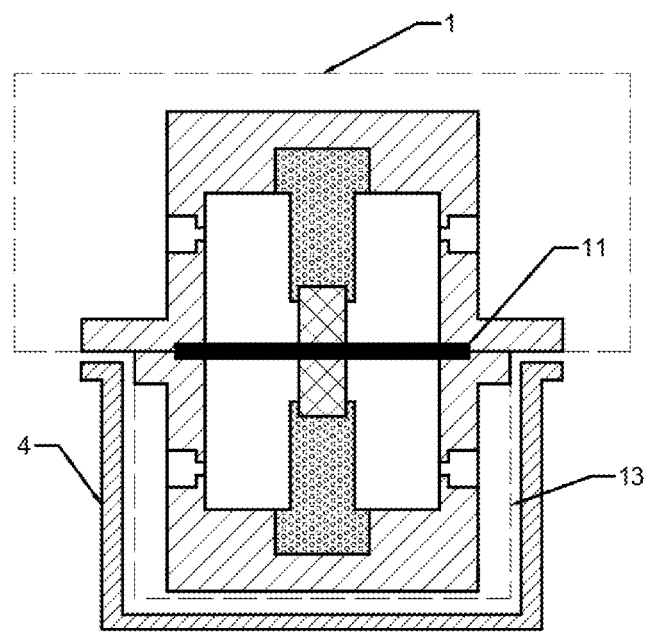
FIG. 5 is a cross-sectional view of the device for measuring the microwave surface resistance of the dielectric conductor deposition interface according to the embodiment 1 of the present invention after loading a calibration holder and two calibration dielectric plates.

The calibration component is detachably arranged on the bottom ends of the dielectric rod 10 and the shielding cavity 5, comprising: a calibration plate 12, a calibration holder 13, and a calibration dielectric plate 11; wherein the calibration plate 12 is a conductor plate with a known microwave surface resistance, which is placed on the bottom end of the dielectric rod 10 loaded with one calibration dielectric plate and the bottom end of the shielding cavity 5. A cross-sectional structure of the device after loading a calibration dielectric plate 11 and the calibration plate 12 is shown in FIG. 4. The calibration dielectric plate 11 comprises two dielectric plates, and sizes and materials of the two dielectric plates are identical to those of a dielectric layer in the dielectric conductor test sample 2. The two dielectric plates replace the dielectric conductor test sample 2 and the support plate 3 to be placed on the bottom end of the dielectric rod 10 and the bottom concave of the shielding cavity 5. The calibration holder 13 and the test platform 1 have the same structure, which are placed opposite to each other and symmetrical about end faces. A cross-sectional structure of the device after loading the calibration holder 13 and two calibration dielectric plates 11 is shown in FIG. 5. The calibration holder 13 and the two calibration dielectric plates 11 can be fixed on the bottom end of the shielding cavity 5 by screws, magnetic attraction or clamping.

The sealing cavity 4 is detachably arranged on an extension part of the bottom end of the shielding cavity 5, so as to shield the calibration component, or the support plate 3 and the dielectric conductor test sample 2.

The shielding cavity 5 is made of silver-plated brass, with an internal diameter of about 40 mm and an internal height of about 20 mm; the dielectric rod 10 is made of a material with low-loss, high-dielectric constant and high Q value, preferably sapphire with a diameter of about 10 mm and a height of about 5 mm; the dielectric supporter 9 is made of a material with low loss and low dielectric constant, preferably polytetrafluoroethylene, with a lower part diameter of about 10 mm, a lower part height of about 10 mm, an upper part diameter of about 15 mm and, an upper part height of about 5 mm.

According to the embodiment 1, a relationship between an unloaded quality factor $Q_0$ of the dielectric resonator formed by the dielectric conductor test sample 2 and the test platform 1 at a test frequency and a microwave surface resistance $R_s$ of the dielectric conductor test sample is:

$$Q_0^{-1} = X + YR_s \quad (1)$$

wherein the working mode is $TE_{0m(n+\delta)}$; X and Y are determined by a structure of the test device and will be further described below; wherein a derivation process of the formula is as follows.

The unloaded quality factor $Q_0$ of the dielectric resonator formed by the dielectric conductor test sample 2, walls of the shielding cavity 5, and the dielectric material (comprising the dielectric supporter 9 and the dielectric rod 10) can be expressed as:

$$\frac{1}{Q_0} = \frac{P_d + P_c + P_{sample}}{\omega_0 W} \quad (2)$$

wherein $\omega_0$ is a resonant angular frequency of the dielectric resonator; $P_c$ is a power consumed by the shielding cavity 5; $P_d$ is a power consumed by the dielectric material; $P_{sample}$ is a power consumed by the microwave surface resistance $R_s$ of the deposition interface of the dielectric conductor test sample 2; and W refers to average energy stored in the dielectric resonator within one cycle of the working mode $TE_{0m(n+\delta)}$ at a resonant frequency $f_0$.

According to the electromagnetic field theory, if the electromagnetic field distribution in the dielectric cavity is known, calculation formulas are as follows:

$$P_c = \frac{R_{SAg}}{2} \int_{S_{Ag}} |H_t|^2 dS \quad (3)$$

$$P_d = \frac{\omega_0}{2} \left[ \int_{V_{rod}} \varepsilon_1'' |E|^2 dV + \int_{V_{ring}} \varepsilon_2'' |E|^2 dV + \int_{V_{sub}} \varepsilon_3'' |E|^2 dV \right] \quad (4)$$

$$P_{sample} = \frac{R_{Ssample}}{2} \int_{S_{sample}} |H_t|^2 dS \quad (5)$$

$$W = \frac{1}{2} \left\{ \int_{V_{rod}} (\varepsilon_1'|E|^2 + \mu_0|H|^2) dV + \int_{V_{ring}} (\varepsilon_2'|E|^2 + \mu_0|H|^2) dV + \int_{V_{sub}} (\varepsilon_3'|E|^2 + \mu_0|H|^2) dV + \int_{V_{air}} (\varepsilon_0|E|^2 + \mu_0|H|^2) dV \right\} \quad (6)$$

wherein $V_{rod}$, $V_{ring}$, $V_{sub}$ and $V_{air}$ are volumes respectively occupied by the dielectric rod 10, the dielectric supporter 9, the dielectric layer of the dielectric conductor test sample 2, and air in the dielectric resonant cavity; $S_{Ag}$ and $S_{sample}$ are respectively surface areas of an internal surface of the shielding cavity 5 and a conductor layer of the dielectric conductor test sample 2; $\varepsilon_1'-j\varepsilon_1''$, $\varepsilon_2'-j\varepsilon_2''$ and $\varepsilon_3'-j\varepsilon_3''$ are respectively dielectric constants of the dielectric rod 10, the dielectric supporter 9 and the dielectric layer of the dielectric conductor test sample 2; $\varepsilon_0$ and $\mu_0$ are respectively permittivity and permeability in vacuum; E is electric field intensity; H is magnetic field intensity; $H_t$ is tangential magnetic field intensity; $R_{SAg}$ and $R_{Ssample}$ are respectively surface microwave resistances at the deposition interface of the shielded cavity 5 and the dielectric conductor test sample 2.

After combining the above formulas, it can be concluded that:

$$\frac{1}{Q_0} = X + YR_{Ssample} \quad (7)$$

wherein:

$$X = \frac{\omega_0 \left[ \int_{V_{rod}} (\varepsilon_1''|E|^2) dV + \int_{V_{ring}} (\varepsilon_2''|E|^2) dV + \int_{V_{sub}} (\varepsilon_3''|E|^2) dV \right] + R_{SAg} \int_{S_{Ag}} |H_t|^2 dS}{\omega_0 \left[ \int_{V_{rod}} (\varepsilon_1'|E|^2 + \mu_0|H|^2) dV + \int_{V_{ring}} (\varepsilon_2'|E|^2 + \mu_0|H|^2) dV + \int_{V_{sub}} (\varepsilon_3'|E|^2 + \mu_0|H|^2) dV + \int_{V_{air}} (\varepsilon_0|E|^2 + \mu_0|H|^2) dv \right]} \quad (8)$$

-continued $$Y = \frac{\left(\int_{S_{sample}} |H_t|^2 dS\right)}{\omega_0 \left[\int_{V_{rod}} (\varepsilon_1'|E|^2 + \mu_0|H|^2) dV + \int_{V_{ring}} (\varepsilon_2'|E|^2 + \mu_0|H|^2) dV + \int_{V_{sub}} (\varepsilon_3'|E|^2 + \mu_0|H|^2) dV + \int_{V_{air}} (\varepsilon_0|E|^2 + \mu_0|H|^2) dv\right]} \quad (9)$$

wherein X and Y are ratios of electromagnetic field integrals; when the dielectric resonant cavity is fixed and field distribution thereof is not affected by perturbation of the dielectric conductor test sample 2, values of X and Y are independent from the dielectric conductor test sample 2, and will not change due to the change of the dielectric conductor test sample 2; at the same time, since X and Y are both constants that have nothing to do with amplitude of the electromagnetic field, after the values of X and Y are determined, the microwave surface resistance $R_s$ can be obtained by measuring the unloaded quality factor $Q_0$ of the dielectric resonator loaded with the dielectric conductor test sample 2:

$$R_s = R_{Ssample} = \left(\frac{1}{Q_0} - X\right)/Y \quad (10)$$

although the values of X and Y can be determined by evaluating the electromagnetic field distribution inside the dielectric resonator, a solution process thereof is very complicated; alternatively, the values of X and Y can be determined by experimental calibration.

Similarly, the above derivation process and the formula (7) are applicable to the dielectric resonant cavity formed after the device is loaded with the calibration plate 12 with a microwave surface resistance $R_{S1}$ as well as the dielectric resonant cavity formed after the device is loaded with the calibration holder 13 and the calibration dielectric plate 11. At this time, $R_{Ssample}$ is replaced with $R_{S1}$ and 0, respectively. Since $TE_{0m(n+\delta)}$ modes have no radial current and there is no loss on the mirror symmetry plane.

Furthermore, the embodiment 1 also provides a method for measuring a microwave surface resistance of a dielectric conductor deposition interface with the above device, wherein a working temperature can be 4.2-800K. The method comprises steps of:

step 1: mounting the calibration plate 12 and one calibration dielectric plate 11 on the test platform 1, fastening with the support plate 3, and then sealing with the sealing cavity 4; keeping an obtained test device at a working temperature of the dielectric conductor test sample 2, and measuring an unloaded quality factor $Q_1$;

step 2: mounting the calibration holder 13 and two calibration dielectric plates 11 on the test platform 1, and then sealing with the sealing cavity 4; keeping the obtained test device at the working temperature of the dielectric conductor test sample 2, and measuring an unloaded quality factor $Q_2$;

step 3: mounting the dielectric conductor test sample 2 on the test platform 1, fastening with the support plate 3, and then sealing with the sealing cavity 4; keeping the obtained test device at the working temperature of the dielectric conductor test sample 2, and measuring an unloaded quality factor $Q_0$; and step 4: putting the unloaded quality factors $Q_1$ and $Q_2$ obtained in the steps 1 and 2 into the formula (7) respectively to get $X=1/Q_2$, $Y=1/Q_1-X/R_{S1}$, thereby obtaining the microwave surface resistance $R_s$ of the dielectric conductor test sample 2 at the test frequency:

$$R_s = \frac{Q_0^{-1} - X}{Y} = \frac{Q_0^{-1} - Q_2^{-1}}{Q_1^{-1} - Q_2^{-1}} \times R_{s1} \quad (11)$$

wherein the microwave surface resistance $R_s$ of the dielectric conductor test sample 2 is obtain, and $R_{s1}$ is a microwave surface resistance of the calibration plate 12 converted from conductivity to the resonance frequency.

In order to further describe the present invention, microwave surface resistance test results of two different dielectric-conductor material deposition interfaces according to the steps and formulas in the embodiment 1 are given below.

Embodiment 2

The dielectric material of the dielectric conductor test sample 2 in the embodiment 2 was made of titanium dioxide and polyphenylene sulfide, wherein copper was coated on one side by a high-temperature and high-pressure process. Two pieces of test samples (sample A and sample B) were prepared, with a diameter of 40 mm, a dielectric layer thickness of 0.5 mm, and a conductor layer thickness of 0.035 mm. The two test samples were tested by the device and the method of the embodiment 1. Calibration test data are shown in Table 1, wherein a working frequency was 11.24 GHz and a working temperature is room temperature 293K. According to the step 1, after loading the calibration plate 12 and one calibration dielectric plate 11, the quality factor $Q_1$ of the working mode test platform 1 was 16063; according to the step 2, after loading two calibration dielectric plates 11 and the calibration holder 13, the quality factor $Q_2$ of the working mode test platform 1 was 35410, which leads to $X=2.824\times10^{-5}$, $Y=9.006\times10^{-5}$. Among them, material and size of the calibration dielectric plate 11 were the same as those of the dielectric part of the dielectric conductor test sample 2. The conductivity of the calibration plate 12 was $3.1\times10^7$S/m, so the microwave surface resistance $R_{S1}=37.84$ mΩ when converted to the resonance frequency. Thereafter, to test the microwave surface resistance of the deposition interface of the dielectric conductor test sample made of the same material, it is only necessary to test the quality factor of the working mode test platform 1 once after loading the dielectric conductor test sample 2. Table 2 and Table 3 show test results of the microwave surface resistance at the deposition interface of the two above-mentioned dielectric conductor test samples (sample A and sample B), respectively. Each sample was tested three times according to the step 3, wherein relative standard deviations of the microwave surface resistance $R_S$ and conductivity σ were no more than 0.1%, indicating excellent repeatability of the device.

TABLE 1

Calibration test data of samples A and B

| Test step | Resonance frequency $f_0$ (GHz) | Quality factor | X | Y |
| --- | --- | --- | --- | --- |
| Step 1 | 11.24 | 16063 | $2.824 \times 10^{-5}$ | $9.006 \times 10^{-5}$ |
| Step 2 | 11.24 | 35410 | | |

TABLE 2

Microwave surface resistance test results of sample A deposition interface

| Sample A | Resonance frequency $f_0$ (GHz) | Quality factor | Surface resistance $R_S$ (mΩ) | Conductivity σ (S/m) | $R_S$ relative standard deviation | σ relative standard deviation |
|---|---|---|---|---|---|---|
| First | 11.24 | 9228 | 89.13 | $5.59 \times 10^6$ | 0.03% | 0.10% |
| Second | 11.24 | 9226 | 89.16 | $5.58 \times 10^6$ | | |
| Third | 11.24 | 9225 | 89.18 | $5.58 \times 10^6$ | | |

TABLE 3

Microwave surface resistance test results of sample B deposition interface

| Sample B | Resonance frequency $f_0$ (GHz) | Quality factor | Surface resistance $R_S$ (mΩ) | Conductivity σ (S/m) | $R_S$ relative standard deviation | σ relative standard deviation |
|---|---|---|---|---|---|---|
| First | 11.24 | 9231 | 89.10 | $5.59 \times 10^6$ | 0.06% | 0.10% |
| Second | 11.24 | 9236 | 89.03 | $5.60 \times 10^6$ | | |
| Third | 11.24 | 9239 | 88.99 | $5.60 \times 10^6$ | | |

Embodiment 3 The dielectric material is zirconia, and the dielectric is single-sided magnetron sputtering and electroplating.

The dielectric material of the dielectric conductor test sample 2 in the embodiment 3 was made of zirconia, wherein copper was coated on one side by single-sided magnetron sputtering and electroplating. Two pieces of test samples (sample I and sample II) were prepared, with a diameter of 40 mm, a dielectric layer thickness of 0.5 mm, and a conductor layer thickness of 0.035 mm. The two test samples were tested by the device and the method of the embodiment 1. Calibration test data are shown in Table 4, wherein a working frequency was 11.21 GHz and a working temperature is room temperature 293K. According to the step 1, after loading the calibration plate 12 and one calibration dielectric plate 11, the quality factor $Q_1$ of the working mode test platform 1 was 11570; according to the step 2, after loading two calibration dielectric plates 11 and the calibration holder 13, the quality factor $Q_2$ of the working mode test platform 1 was 30139, which leads to X=$3.318\times10^{-5}$, Y=$1.110\times10^{-6}$. Among them, material and size of the calibration dielectric plate 11 were the same as those of the dielectric part of the dielectric conductor test sample 2. The conductivity of the calibration plate 12 was $3.1\times10^7$ S/m, so the microwave surface resistance $R_{S1}$=37.78 mΩ when converted to the resonance frequency. Thereafter, to test the microwave surface resistance of the deposition interface of the dielectric conductor test sample made of the same material, it is only necessary to test the quality factor of the working mode test platform 1 once after loading the dielectric conductor test sample 2. Table 5 and Table 6 show test results of the microwave surface resistance at the deposition interface of the two above-mentioned dielectric conductor test samples (sample I and sample II), respectively. Each sample was tested three times according to the step 3, wherein relative standard deviations of the microwave surface resistance $R_S$ and conductivity σ were no more than 0.4%, indicating excellent repeatability of the device.

TABLE 4

Calibration test data of samples I and II

| Test step | Resonance frequency $f_0$ (GHz) | Quality factor | X | Y |
|---|---|---|---|---|
| Step 1 | 11.21 | 11570 | $3.318 \times 10^{-5}$ | $1.110 \times 10^{-6}$ |
| Step 2 | 11.21 | 30139 | | |

TABLE 5

Microwave surface resistance test results of sample I deposition interface

| Sample I | Resonance frequency $f_0$ (GHz) | Quality factor | Surface resistance $R_S$ (mΩ) | Conductivity σ (S/m) | $R_S$ relative standard deviation | σ relative standard deviation |
|---|---|---|---|---|---|---|
| First | 11.21 | 12539 | 33.04 | $4.05 \times 10^7$ | 0.13% | 0.29% |
| Second | 11.21 | 12554 | 32.97 | $4.07 \times 10^7$ | | |
| Third | 11.21 | 12536 | 33.05 | $4.05 \times 10^7$ | | |

TABLE 6

Microwave surface resistance test results of sample II deposition interface

| Sample II | Resonance frequency $f_0$ (GHz) | Quality factor | Surface resistance $R_S$ (mΩ) | Conductivity σ (S/m) | $R_S$ relative standard deviation | σ relative standard deviation |
|---|---|---|---|---|---|---|
| First | 11.21 | 12584 | 32.84 | $4.10 \times 10^7$ | 0.19% | 0.37% |
| Second | 11.21 | 12590 | 32.81 | $4.11 \times 10^7$ | | |
| Third | 11.21 | 12610 | 32.72 | $4.13 \times 10^7$ | | |

According to the embodiment 2 and the embodiment 3, it requires no pre-measurement of relative permittivity and loss tangent of the dielectric material test sample. The calibration plate 12 can adapt to dielectric-conductor samples of various sizes and materials. For dielectric-conductor test samples of the same type, once the calibration is completed, the microwave surface resistance of the dielectric conductor deposition surface can be obtained in a one-step test, which provides high test efficiency in mass testing.

It should be noted that the present invention and accompanying drawings has illustrated the preferred embodiments of the testing method to help readers better understand the present invention, while various modifications and substitutions can be made to the present invention. All modifications, substitutions, improvements, etc. made within the spirit and principles of the present invention shall fall in the protection scope of the appended claims.

What is claimed is:

1. A device for measuring a microwave surface resistance of a dielectric conductor deposition interface, comprising: a test platform, a calibration component, a sealing cavity and a support plate;
   wherein the test platform comprises: a shielding cavity having an open bottom, a dielectric rod, an input coupling structure, an output coupling structure, and a dielectric supporter; wherein the input coupling structure and the output coupling structure are symmetrically distributed on two sides of the shielding cavity; the dielectric rod is located inside the shielding cavity, and is fixed to the shielding cavity by the dielectric supporter; a bottom end of the dielectric rod and a bottom end of the shielding cavity are on a same plane;

wherein a dielectric conductor test sample is placed on the bottom end of the dielectric rod and a bottom concave of the shielding cavity, and is detachably fastened by the support plate to form a $TE_{0m(n+\delta)}$ (m, n=1, 2, 3 . . . ) mode dielectric resonator with the test platform; wherein the dielectric conductor test sample is obtained by depositing a conductor on a dielectric; a dielectric side of the dielectric conductor test sample faces an interior of the dielectric resonator, and a conductor side is attached to the support plate;

wherein the calibration component is detachably arranged on the bottom end of the shielding cavity; and wherein the sealing cavity is detachably arranged on an extension part of the bottom end of the shielding cavity.

2. The device, as recited in claim 1, wherein the calibration component comprises: a calibration plate, a calibration holder, and two calibration dielectric plates; wherein the calibration plate is a conductor plate with a known microwave surface resistance; the calibration dielectric plate comprises two dielectric plates, and sizes and materials of the two dielectric plates are identical to those of a dielectric layer in the dielectric conductor test sample; an internal resonant structure of the calibration holder is identical to that of the test platform, and the calibration holder are placed opposite to the test platform; the calibration holder and the test platform are symmetrical about end faces.

3. The device, as recited in claim 1, wherein the shielding cavity is made of a hard metal material; the dielectric rod is rutile, sapphire or beryllium oxide ceramics; and the dielectric supporter is nylon, polytetrafluoroethylene or polyethylene foam.

4. The device, as recited in claim 1, wherein both the input coupling device and the output coupling device adopt a coupling hole-to-coaxial structure.

5. The device, as recited in claim 1, wherein for the $TE_{0m(n+\delta)}$ (m, n=1, 2, 3 . . . ) mode dielectric resonator, a resonant frequency and a physical size thereof are calculated through analyzing Maxwell's equations based on boundary conditions.

6. A method for measuring a microwave surface resistance of a dielectric conductor deposition interface with a device comprising: a test platform, a calibration component, a sealing cavity and a support plate;

wherein the test platform comprises: a shielding cavity having an open bottom, a dielectric rod, an input coupling structure, an output coupling structure, and a dielectric supporter; wherein the input coupling structure and the output coupling structure are symmetrically distributed on two sides of the shielding cavity; the dielectric rod is located inside the shielding cavity, and is fixed to the shielding cavity by the dielectric supporter; a bottom end of the dielectric rod and a bottom end of the shielding cavity are on a same plane;

wherein a dielectric conductor test sample is placed on the bottom end of the dielectric rod and a bottom concave of the shielding cavity, and is detachably fastened by the support plate to form a $TE_{0m(n+\delta)}$ (m, n=1, 2, 3 . . . ) mode dielectric resonator with the test platform; wherein the dielectric conductor test sample is obtained by depositing a conductor on a dielectric; a dielectric side of the dielectric conductor test sample faces an interior of the dielectric resonator, and a conductor side is attached to the support plate;

wherein the calibration component is detachably arrange on the bottom end of the shielding cavity; and wherein the sealing cavity is detachably arranged on an extension part of the bottom end of the shielding cavity;

wherein the method comprises steps of:

step 1: mounting the calibration plate and one calibration dielectric plate on the test platform, fastening with the support plate, and then sealing with the sealing cavity; keeping an obtained test device at a working temperature of the dielectric conductor test sample, and measuring an unloaded quality factor $Q_1$;

step 2: mounting the calibration holder and two calibration dielectric plates on the test platform, and then sealing with the sealing cavity; keeping the obtained test device at the working temperature of the dielectric conductor test sample, and measuring an unloaded quality factor $Q_2$;

step 3: mounting the dielectric conductor test sample on the test platform, fastening with the support plate, and then sealing with the sealing cavity; keeping the obtained test device at the working temperature of the dielectric conductor test sample, and measuring an unloaded quality factor $Q_0$; and step 4: calculating with a formula:

$$R_s = \frac{Q_0^{-1} - Q_2^{-1}}{Q_1^{-1} - Q_2^{-1}} \times R_{s1}$$

to obtain a microwave surface resistance $R_s$ of the dielectric conductor test sample; wherein $R_{s1}$ is a microwave surface resistance of the calibration plate.

* * * * *